US008894769B2

(12) United States Patent
Chaix et al.

(10) Patent No.: US 8,894,769 B2
(45) Date of Patent: Nov. 25, 2014

(54) MATERIAL EVAPORATION CHAMBER WITH DIFFERENTIAL VACUUM PUMPING

(75) Inventors: Catherine Chaix, La Celle-Saint-Cloud (FR); Alain Jarry, Verneuil sur Seine (FR); Pierre-André Nutte, Paris (FR); Jean-Pierre Locquet, Bern (CH); Jean Fompeyrine, Waedenswil (CH); Heinz Siegwart, Zurich (CH)

(73) Assignee: Riber, Bezons (FR)

( * ) Notice: Subject to any disclaimer, the term of this patent is extended or adjusted under 35 U.S.C. 154(b) by 2215 days.

(21) Appl. No.: 10/518,119

(22) PCT Filed: Jun. 18, 2003

(86) PCT No.: PCT/FR03/01868
§ 371 (c)(1),
(2), (4) Date: Apr. 10, 2006

(87) PCT Pub. No.: WO03/106731
PCT Pub. Date: Dec. 24, 2003

(65) Prior Publication Data
US 2006/0216161 A1    Sep. 28, 2006

(30) Foreign Application Priority Data
Jun. 18, 2002 (FR) .................................. 02 07501

(51) Int. Cl.
*C23C 14/24* (2006.01)
*C23C 16/00* (2006.01)
*C30B 23/02* (2006.01)
*C23C 14/56* (2006.01)
*C30B 35/00* (2006.01)

(52) U.S. Cl.
CPC ............... *C23C 14/24* (2013.01); *C30B 23/02* (2013.01); *C23C 14/564* (2013.01); *C30B 35/00* (2013.01)

USPC .................... 118/726; 118/719; 118/723 VE; 417/313

(58) Field of Classification Search
USPC ..................................................... 118/723 VE
See application file for complete search history.

(56) References Cited

U.S. PATENT DOCUMENTS 4,654,231 A * 3/1987 Nyberg et al. ........... 427/255.31
4,813,373 A * 3/1989 Demay et al. ................. 118/726
(Continued)

FOREIGN PATENT DOCUMENTS

EP    0276914    1/1988
EP    0302506    8/1988
(Continued)

OTHER PUBLICATIONS

PCT/FR03/01868 International Search Report.

*Primary Examiner* — Parviz Hassanzadeh
*Assistant Examiner* — Nathan K Ford
(74) *Attorney, Agent, or Firm* — Young & Thompson

(57) ABSTRACT

The invention concerns a material evaporation chamber including a vacuum chamber (10), a first pumping unit (13) to pump said chamber and sources of material. According to the invention, a wall (23) liable to provide total or partial vacuum tightness, delineates within this chamber a first volume (25) and a second volume (22). Certain sources of material (17) having a main axis (18) are placed in the second volume (22). This second volume (22) is pumped by a second pumping unit (24). The wall (23) includes recesses (26) which are each centered on the main axis (18) of one of the sources of material (17). The evaporation chamber also comprises means (27) for plugging or clearing each of said recesses (26), said means (27) being controlled individually to protect the sources of material (17) having a main axis (18) unused.

20 Claims, 3 Drawing Sheets

(56) References Cited

U.S. PATENT DOCUMENTS

| | | | |
|---|---|---|---|
| 5,423,914 A * | 6/1995 | Nakamura et al. | 118/719 |
| 5,556,472 A | 9/1996 | Nakamura et al. | |
| 5,588,999 A * | 12/1996 | Takahashi | 118/715 |
| 5,622,918 A | 4/1997 | Nakamura | |
| 5,951,767 A * | 9/1999 | Colombo | 118/688 |
| 6,142,097 A * | 11/2000 | Tomofuji | 118/723 VE |
| 2002/0153102 A1 * | 10/2002 | Bernard et al. | 156/345.29 |

FOREIGN PATENT DOCUMENTS

| | | |
|---|---|---|
| EP | 0655514 | 11/1994 |
| JP | 56-45344 A | 4/1981 |
| JP | 57-155376 A | 9/1982 |
| JP | 57-162371 A | 10/1982 |
| JP | 62-65732 A | 3/1987 |
| JP | 62-235464 A | 10/1987 |
| JP | 2-106822 A | 4/1990 |
| JP | 5-331626 A | 12/1993 |
| JP | 8-67968 A | 3/1996 |
| JP | 10-195641 A | 7/1998 |
| WO | 01/54472 A2 | 8/2001 |
| WO | WO0155472 | 8/2001 |

* cited by examiner

MATERIAL EVAPORATION CHAMBER WITH DIFFERENTIAL VACUUM PUMPING

The present invention concerns a vacuum material evaporation chamber.

The degree of cleanliness of a surface or of purity of a film deposited is primordial in technical fields such as nanotechnologies, catalytic chemistry, biotechnologies.

In nanotechnologies, for example, whereof the scope relates to objects of the order of a few nanometers to a few micrometers, the understanding of phenomena such as the growth of films, the photo-induced reactions in said films is only possible if the films and, the substrates whereon they are formed, are exempt of any contamination.

In the field of semi-conductors, the growth of films exhibiting little impurities, and therefore little unintentional dopants, is also essential. The deposition of pure materials in known quantity on semi-conductive surfaces is, indeed, particularly important for the realisation de metal-semi-conductor junctions and semi-conductive heterostructures. The former can be found in all the metal contacts of the semi-conductive devices, for example, the Ohmic contacts of electronic detector. The latter are important for the optoelectronic devices.

Finally, the metal heterostructures also enjoy a marked interest because of their possible applications in fields such as magnetism.

One of the current techniques to prepare such structures under ultra-vacuum is MBE (Molecular Beam Epitaxy). With this technique, epitaxial layers are obtained by the transport of the material, containing the elements making up the layer to form, up to a substrate, metallic or semi-conductive, where it is adsorbed. Molecular beam epitaxy enables to obtain, in particular for semi-conductors, a growth of doped-controlled layers and whereof the chemical composition may be varied in depth on the space of a few Angströms.

An evaporation chamber contains therefore several sources of material 1 (FIG. 1). These sources 1 are used alternately relative to piled layers to be formed. Diverse sources of material 1 may be contemplated, the most current one being evaporation from a cell containing a crucible heated by Joule effect. Other possibilities include the use of a source of plasma whereof gas is, for instance, oxygen ($O_2$), hydrogen ($H_2$), nitrogen ($N_2$) or others, or gas injectors or still electronic bombarding evaporation guns. When these sources 1 are cells, their crucibles have generally a cylindrical or conical shape, or other, open at one end 2 and are mounted so that said open end 2 is placed opposite the substrate 3 whereon material must be deposited.

As described previously, one of the imperatives of these deposition systems is the low contamination of the films formed. Besides the deposition of material in a chamber 4 under vacuum and preferably under ultra-vacuum, i.e. at a pressure lower than $10^{-9}$ Torr, the sources of material 1 should not, themselves, be a possible source of contamination. They are therefore subject to an in-depth degassing operation.

However, the presence de several sources 1 in the evaporation chamber is at the origin of another type de contamination: a crossed contamination of the sources of material 1. This contamination may, partially, be that of the solid sources by the gas in presence (ionised or not). When one of these sources 1 is used subsequently, not only the elements of said crucible are evaporated towards the substrate 3 but possibly also adsorbed contaminating elements or having reacted with said source. The layer thus deposited on the substrate 3 then contains unintentional impurities which may influence, in the case of semi-conductive material, not only on its doping but also the properties of the material. The presence of storage panels 5 with liquid nitrogen circulation placed in the vicinity of these sources 1 to condense the gas and of individual masks 6 placed before the sources 1 unused does not provide totally satisfactory a solution to avoid such crossed contamination.

The object de the present invention is to suggest a vacuum material evaporation chamber, simple in its design and in its operating mode, including material evaporation sources for the growth of layers on a substrate which are protected from any type of contamination.

To this end, the invention concerns a material evaporation chamber including a vacuum chamber, a first pumping unit to pump said chamber and sources of material.

According to the invention, a wall liable to provide total or partial vacuum tightness, delineates within the vacuum chamber a first volume pumped by said first pumping unit and a second volume pumped by a second pumping unit, certain of said sources of material having a main axis are placed in the second volume and other sources are placed in the first volume, said wall includes recesses, each recess being centred on the main axis of one of the sources of material having a main axis, and the chamber contains means for plugging or clearing each of said recesses, said means being controlled individually to protect the sources of material having a main axis unused.

The present invention also concerns the characteristics which will appear during the following description and which should be considered individually or according to all their technically possible combinations:

the means for plugging or clearing said recesses include masks, when growing, the flow rate, through the recesses cleared, of the elements forming the materials from the first volume is pumped by the second pumping unit.

By "growth" is meant the progressive development of layers on the sample by adsorption of the elements forming materials evaporated by the sources placed in the evaporation chamber. The growth in co-evaporation wherein at least one of the sources of material placed in the first volume and at least one of the sources placed in the second volume are implemented simultaneously and the sequential growth where a single one of the sources placed in the evaporation chamber is in operation at a given time, should be distinguished. II the latter case, during the operation of one of the sources placed in the first volume, the means for plugging or clearing each of said recesses are in plugging position.

the wall liable to provide total or partial vacuum tightness contains a plate, the first pumping unit contains a primary pump and a secondary pump, the second pumping unit contains a secondary pump, the first volume and the second volume include at least one liquid nitrogen storage panel, the second volume delineated by the wall has a pressure lower than $10^{-7}$ Torr.

the evaporation chamber contains means for controlling the pressure to measure independently the pressure in the first volume and the second volume, the sources of material having a main axis placed in the second volume include crucible cells heated by Joule effect, the sources of material having a main axis placed in the second volume include electronic bombarding evaporation guns, the sources placed in the first volume include at least one source of plasma, the sources placed in the first volume include at least one gas injector.

The invention will be described more in detail with reference to the appended drawings wherein.

Figure 1:
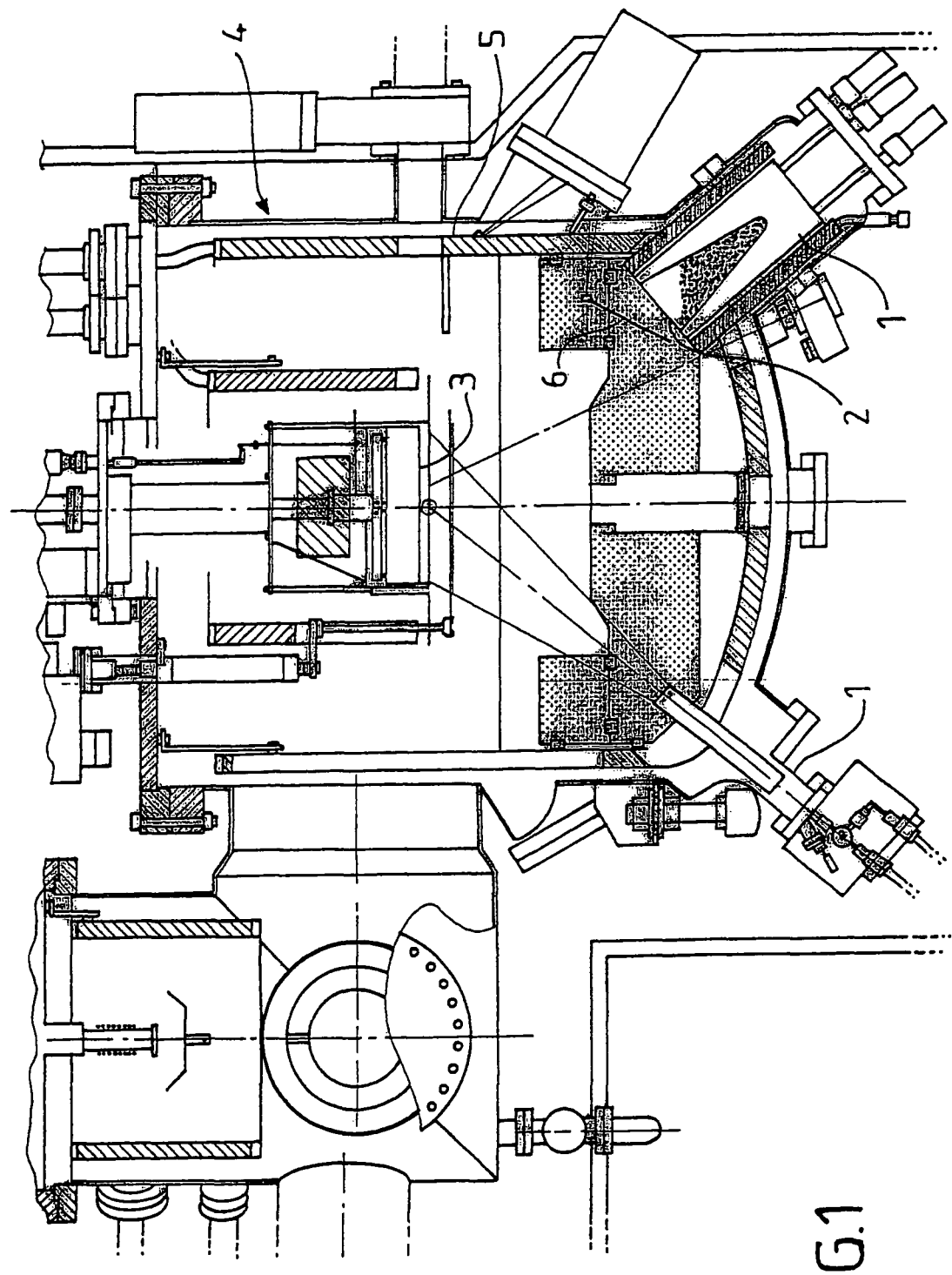
FIG. 1 is a schematic representation of an evaporation chamber of the previous art.

The material evaporation chamber, according to the invention, contains a vacuum chamber 10 including a sample 11 which may be mounted on a manipulator 12. The first object of this chamber is the growth of layers by evaporation of pure materials, in a known quantity on this sample 11. It may be any type of material liable to be usually evaporated under vacuum (Aluminium (Al), Calcium (Ca), Indium (In), Lanthanum (La), Lithium (Li), Gallium (Ga), Strontium (Sr), Titanium (Ti), Yttrium (Y), Zirconium (Zr), . . . ). Said chamber 10 includes preferably transfer flanges or taps enabling to connect said chamber to other chambers to form a single vacuum assembly for the treatment and the preparation of a sample 11, possibly the analysis and the modification of said sample 11 formed. The transport of said sample 11 from one chamber to another is then carried by manipulating arms.

The evaporation chamber is pumped by a first pumping unit 13. This first pumping unit 13 contains preferably a primary pump and a secondary pump, for instance, a cryogenic pump or a turbomolecular pump, or other. Besides, said pumping unit 13 may contain a Titanium sublimator 14 and a cryogenic panel 15. The chamber 10 may contain a general cryogenic panel 16 enabling to maintain the purity of the layers. The chamber also comprises means for controlling the pressure within said chamber. These control means include, for instance, so-called BAYARD-ALPERT gauges connected to an external pressure control device.

The evaporation chamber contains sources of material. Diverse sources of material may be contemplated, the most current one being the evaporation from a source 17 of Knudsen type. It is then a crucible heated by Joule effect. The crucible which may be realised of boron nitride or high purity graphite, for instance, has a cylindrical or conical shape, or other, having a main axis 18. One of the ends 19 of said crucible is open and placed opposite the manipulator 12. This Joule effect may be obtained by using a resistant element for instance, a filament. The filament is advantageously realised made of Tantalum (Ta) but may also be realised in other refractory materials (Molybdenum (Mo), Tungsten (W), . . . ). In another embodiment, evaporation is generated by electronic bombarding of a source material in an evaporation gun 20.

The evaporation chamber also contains other sources of material 21 such as sources of plasma or gas injectors whereof the product is liable to react with the materials of the sources 17 having a main axis 18. This main axis 18 also defines a main evaporation axis. The plasma supporting gas or the gas of the injector is then chosen among oxygen ($O_2$), nitrogen ($N_2$), hydrogen ($H_2$), . . . . Preferably, the sample 11 is also temperature controlled, i.e. its temperature may be varied according to the elements to be deposited on the surface of said sample 11.

According to the invention, the sources of material 17 having a main axis 18 are placed in a volume 22 delineated within said chamber by a wall 23. This wall 23 may ensure total or partial vacuum tightness and the volume delineated 22 by the wall 23 is pumped by a second pumping unit 24. This wall 23 is in an embodiment made of metal (Tantalum, Molybdenum, stainless steel, . . . ). We shall therefore distinguish a first volume 25 containing the sources 21 such as plasma sources or gas injectors, said volume being pumped by the first pumping unit 13, and a second volume 22 including the sources of materials 17 having a main axis 18 such as crucible cells, and electronic bombarding evaporation guns 20.

Said wall 23 includes recesses 26, each recess 26 being centred on the main axis 18 of one of the sources of material 17 having a main axis 18 placed in the second volume 22. When the source of material 17 corresponding to a recess 26 is in operation, the molecular beam transmitted by this source goes, on its way to the sample 11, through said recess 26. In order to maintain significant vacuum in the second volume 22 delineated by the wall 23, i.e. a pressure smaller than $10^{-7}$ Torr and preferably than $10^{-9}$ Torr, the chamber 10 contains means 27 for plugging each of said recesses 26. These means 27 are controlled individually to clear the recess 26 of a source of material 17 selected. These means 27 for plugging each of said recesses 26 are in an embodiment masks, for instance, toggling or linear masks, or others. These means 27 enable to protect the sources of material 17 from possible contaminations. These contaminations may result, for instance, from the operation of one of the sources 21 (gas injector, plasma source, . . . ) placed in the first volume 25. Advantageously, the partial pressure $p_1$ measured in the first volume 25 during a deposition does not affect substantially the pressure $p_2$ measured in the second volume 22 pumped by the second pumping unit. In other words, when growing, the flow rate of the elements forming the plasma, for instance, through the open recesses 26 is smaller than the pumping speed S of the second pumping unit 24 and is therefore pumped by said unit. However, even if said flow rate is greater than the pumping speed, the differential pumping principle enables nevertheless to protect the sources of materials 17. Indeed, the quantity of the elements forming the plasma which will have entered the lower portion of the chamber will be pumped by the second pumping unit 24, once the recesses 26 of the wall 23 have been plugged by the closed masks 27. The time for which elements forming the plasma in the vicinity of the sources of material 17 will therefore only be limited. The second pumping unit 24 contains at least one secondary pump such as a cryogenic pump, a turbomolecular pump or other. The second volume 22 delineated by the wall 23 may also comprise at least one liquid nitrogen circulation storage panel 28. These additional condensation surfaces enable to limit the presence of impurities in the molecular beam and in the second volume 22. Preferably, the pressure in the second volume 22 delineated by the wall 23 is measured by so-called BAYARD-ALPERT type pressure control means.

Figure 2:
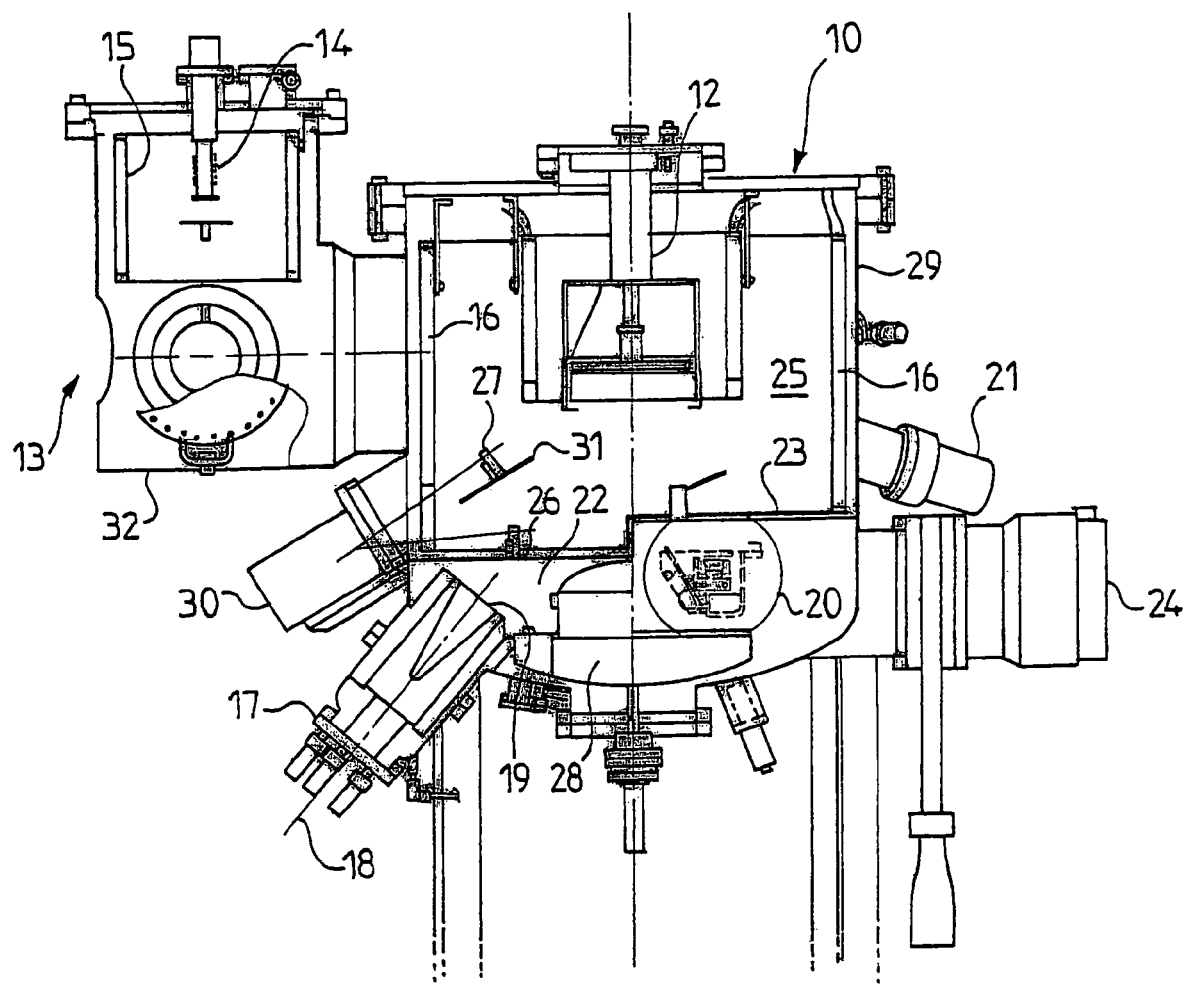
FIG. 2 is a schematic representation of a material evaporation chamber, according to an embodiment of the invention.

FIG. 2 shows an embodiment of the invention. The volume de the evaporation chamber is divided in a first volume 25 and a second volume 22 by a wall 23. This wall 23 is a plate of molybdenum which is attached to the lateral walls 29 of the cabinet 10 to ensure vacuum total or partial tightness. It is in this case welded or attached to said walls 29. This plate 23 includes recesses 26 whereof a single one is schematised on FIG. 2 by simplification. This recess 26 is centred on the main axis 18 of a source of material 17 placed in the second volume 22 delineated by the plate 23, in the lower portion of the evaporation chamber. Means 27 enable to plug and to clear said recess 26. These means 27 include a toggling mask actuated by an external toggling device 30. Each mask 27 is controlled individually. When a mask 27 is in plugging position, the blade 31 of the mask is parallel to the surface of the plate 23 around the recess 26 considered in order to ensure perfect contact between said surface and the mask 27. This tightness is also reinforced by the differential pressure which exists between the first volume 25 and the second volume 22 when operating one of the sources 21 such as a source de plasma or a gas injector, placed in the first volume 25.

The first volume 25 of the evaporation chamber is pumped by a first pumping unit 13 formed of a pumping well 32 including un cryogenic panel 15 therefore providing a condensation surface, one or several secondary cryogenic pumps serving simultaneously for creating a vacuum inside the chamber and for pumping elements in presence during the growth of layers, a Titanium sublimator 14 to ensure the creation of vacuum. The second volume 22 delineated by the plate 23 is for its own part pumped by a turbomolecular pump 24 and a liquid nitrogen circulation storage panel 28 for pumping species in presence during the growth of layers and when opening the mask 27 of the corresponding source selected.

Figure 3:
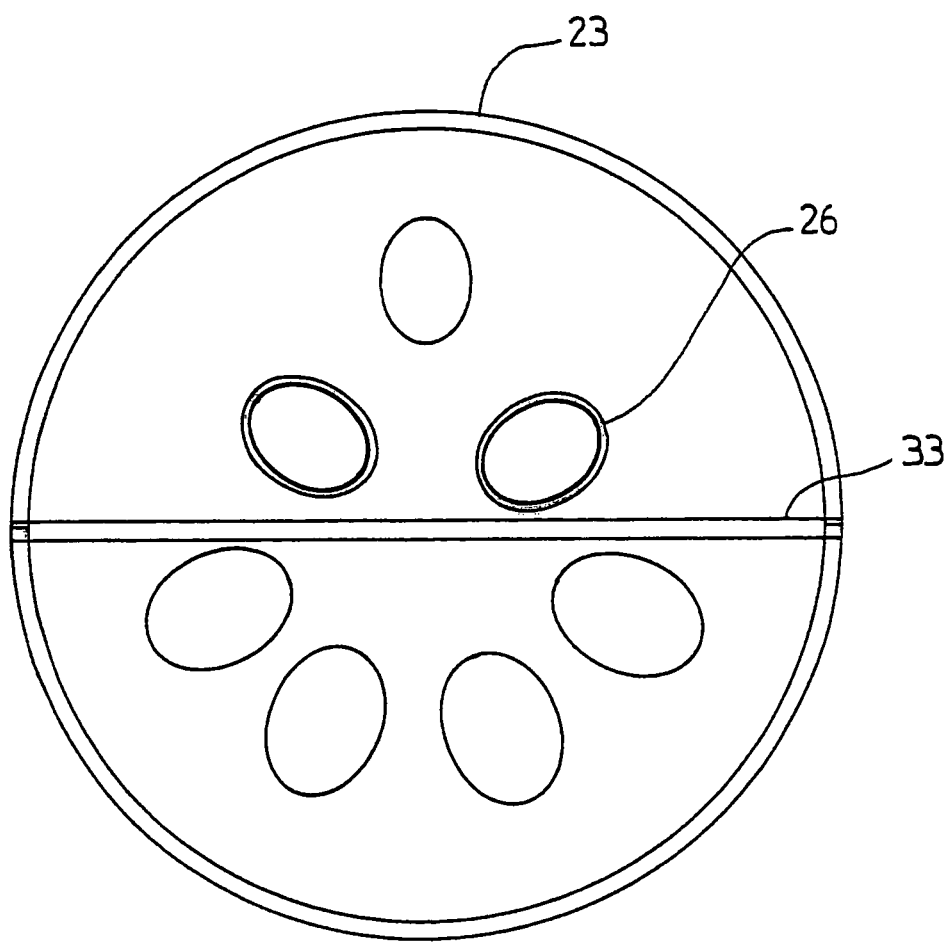
FIG. 3 is a top view of a wall liable to provide total or partial vacuum tightness, according to an embodiment of the invention.

FIG. 3 shows a top view of the plate 23 described in the previous embodiment, corresponding to FIG. 2. This plate 23 includes recesses 26 which have an elliptic shape. This elliptic shape results from the influence of the tubular shape of the sources of material 17 and the tilting of their main axis 18 with respect to the plate 23. The double line 33 schematises the crank of the plate 23 in its centre, appearing on FIG. 2.

The sources of material 17 having a main axis 18 placed in the second volume 22 delineated by the wall 23 and the sources 21 such as a plasma source or gas injector placed in the first volume 25 are used in this evaporation chamber to obtain the growth of oxide layers, nitride layers or of semiconductors.

The invention claimed is:

1. An evaporation chamber for growth of materials on a sample, said evaporating chamber comprising:
   a vacuum chamber;
   first and second pumping units;
   a wall providing total or partial vacuum tightness and delineating within the vacuum chamber a first volume pumped by said first pumping unit and a second volume pumped by said second pumping unit, said wall comprising a plate; and
   a manipulator for mounting the sample in the first volume;
   wherein certain sources of material by evaporation having a main axis are placed individually in the second volume and other sources of plasma or gas injectors are placed in the first volume,
   wherein said wall includes a plurality of recesses, each recess defining an opening and being centered on the main axis of each of the sources of material having the main axis, and
   wherein the chamber includes a plurality of toggle masks each of said toggling mask being actuated by an external toggling device and controlled individually, each toggle mask comprising a blade, each toggle mask for plugging or clearing a corresponding one of said recesses and, when in a plugging position, for ensuring vacuum tightness between said first volume and said second volume, each of said individually placed sources in the second volume has a corresponding one of the toggle masks being controlled individually so that when the source of material in the second volume corresponding to an opening is selected, the molecular beam transmitted by this source goes, on a way to the sample, through said opening,
   wherein, i) when said mask is in the plugging position, the blade is parallel to the surface of the plate around the corresponding recess in order to ensure a seal between said surface and the mask, and ii) when the mask is in a clearing position, said blade is not parallel to the surface of the plate in order to clear the corresponding recess of a selected source of materials in the second volume, and
   wherein the second volume is pumped by the second pumping unit for pumping species in presence during the growth of layers when opening the mask of the corresponding selected source of materials, and
   wherein the first pumping unit and the second pumping unit generates a differential pressure between the first volume and the second volume when a toggle mask corresponding to a source of material selected in the second volume is open, in order to protect the unused sources of materials in the second volume, the tightness of the masks in the plugging position being reinforced by the differential pressure which exists between the first volume and the second volume.

2. An evaporation chamber according to claim 1, wherein during the growth of layers on a substrate, the flow of the elements forming the materials from the first volume is pumped by the second pumping unit, through the recesses cleared.

3. An evaporation chamber according to claim 1, wherein the first pumping unit contains a primary pump and a secondary pump.

4. An evaporation chamber according to claim 3, wherein the first volume and the second volume include at least one liquid nitrogen storage panel.

5. An evaporation chamber according to claim 1, wherein the second pumping unit contains a secondary pump.

6. An evaporation chamber according to claim 1, wherein the second volume delineated by the wall has a pressure lower than $10^{-7}$ Torr.

7. An evaporation chamber according to claim 1, wherein the evaporation chamber contains means for controlling the pressure in order to measure independently the pressure in the first volume and the second volume.

8. An evaporation chamber according to claim 1, wherein the sources of material having the main axis placed in the second volume include crucible cells heated by Joule effect.

9. An evaporation chamber according to claim 1, wherein the sources of material having the main axis placed in the second volume include electronic bombarding evaporation guns.

10. An evaporation chamber according to claim 1, wherein the sources placed in the first volume include at least one source of plasma.

11. An evaporation chamber according to claim 1, wherein the sources placed in the first volume include at least one gas injector.

12. An evaporation chamber according to claim 1, wherein each of the plurality of masks covers or exposes no more than one of said individually placed sources in the second volume.

13. An evaporation chamber for growth of materials on a sample, said evaporating chamber comprising:
   first and second pumping units;
   a toggling device;
   a vacuum chamber connected to the first and second pumping units, the toggling device being mounted external to the chamber, the vacuum chamber including i) a wall delineating a first volume pumped by said first pumping unit and a second volume pumped by a second pumping unit, and ii) a plurality of toggle masks, said wall comprising a plate and a plurality of recesses, each recess defining an opening and being centered on a main evaporation axis, each of said toggling mask being actuated by the toggling device and individually controlled, each toggle mask for plugging or clearing a corresponding one of said recesses and, when in a plugging position, for ensuring vacuum tightness between said first volume and said second volume, each toggle mask comprising a blade, first sources of material, by evaporation, having a main axis placed individually in the second volume such that the recesses are centered on the main axis of each of the sources of material;

second sources of material comprised of plasma or gas injectors located in the first volume; and a manipulator for mounting the sample in the first volume, wherein each of said individually placed first sources in the second volume has a corresponding one of the toggle masks being individually controlled such that when selecting one first source in the second volume corresponding to a first opening, the molecular beam transmitted by the selected one first source goes, on a way to the sample, through said first opening, wherein, i) when said mask is in the plugging position, the blade is parallel to the surface of the plate around the corresponding recess in order to provide a seal between said surface and the mask, and ii) when the mask is in a clearing position, said blade clears the corresponding recess of the selected one first source, wherein the second volume is pumped by the second pumping unit for pumping species in presence during the growth of layers when opening the mask of the corresponding selected one first source, and wherein the first pumping unit and the second pumping unit generate a differential pressure between the first volume and the second volume when a toggle mask corresponding to the selected one first source is open, in order to protect unused first sources in the second volume, the tightness of the masks in the plugging position being reinforced by the differential pressure between the first volume and the second volume.

14. The evaporation chamber according to claim 13, wherein during the growth of layers on a substrate, a flow of the elements forming the materials from the first volume is pumped by the second pumping unit through a cleared recess.

15. The evaporation chamber according to claim 13, wherein the first pumping unit contains a primary pump and a secondary pump.

16. The evaporation chamber according to claim 13, wherein the second pumping unit contains a secondary pump.

17. The evaporation chamber according to claim 13, wherein the first sources of material include electronic bombarding evaporation guns.

18. The evaporation chamber according to claim 13, wherein the second sources of material include at least of plasma source.

19. The evaporation chamber according to claim 13, wherein the second sources of material include at least one gas injector.

20. The evaporation chamber according to claim 13, wherein each mask plugs or clears no more than one of said first sources of material in the second volume.

\* \* \* \* \*